United States Patent
Yamashita et al.

(10) Patent No.: US 10,439,045 B1
(45) Date of Patent: Oct. 8, 2019

(54) FLIPPED VFET WITH SELF-ALIGNED JUNCTIONS AND CONTROLLED GATE LENGTH

(71) Applicant: INTERNATIONAL BUSINESS MACHINES CORPORATION, Armonk, NY (US)

(72) Inventors: Tenko Yamashita, Schenectady, NY (US); Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/974,728

(22) Filed: May 9, 2018

(51) Int. Cl.
| H01L 29/66 | (2006.01) |
| H01L 21/8234 | (2006.01) |
| H01L 27/088 | (2006.01) |
| H01L 29/78 | (2006.01) |

(52) U.S. Cl.
CPC .......... *H01L 29/66666* (2013.01); *H01L 21/823431* (2013.01); *H01L 27/0886* (2013.01); *H01L 29/66545* (2013.01); *H01L 29/66795* (2013.01); *H01L 29/785* (2013.01); *H01L 29/7848* (2013.01)

(58) Field of Classification Search
CPC combination set(s) only.
See application file for complete search history.

(56) References Cited

U.S. PATENT DOCUMENTS

| 6,297,531 | B2 | 10/2001 | Armacost et al. |
| 6,335,214 | B1 | 1/2002 | Fung |
| 6,770,534 | B2 | 8/2004 | Cho et al. |
| 7,087,472 | B2 | 8/2006 | Hadizad |
| 7,683,428 | B2 | 3/2010 | Chidambarrao et al. |
| 8,450,177 | B2 | 5/2013 | Marchant et al. |
| 8,716,091 | B2 | 5/2014 | Cohen et al. |
| 8,946,007 | B2 | 2/2015 | Doris et al. |
| 9,530,863 | B1 * | 12/2016 | Zhang .............. H01L 29/66545 |
| 9,647,123 | B1 * | 5/2017 | Balakrishnan ........ H01L 29/785 |
| 2006/0261406 | A1 | 11/2006 | Chen |
| 2007/0262377 | A1 | 11/2007 | Asa |

* cited by examiner

*Primary Examiner* — Matthew L Reames
(74) *Attorney, Agent, or Firm* — Cantor Colburn LLP; Vazken Alexanian

(57) ABSTRACT

A technique relates to a semiconductor device. A vertical channel layer is formed with inner spacers on opposite ends of the vertical channel layer. A gate stack is formed having a gate length determined by the inner spacers. Source or drain (S/D) regions are formed on the opposite ends of the vertical channel layer.

2 Claims, 13 Drawing Sheets

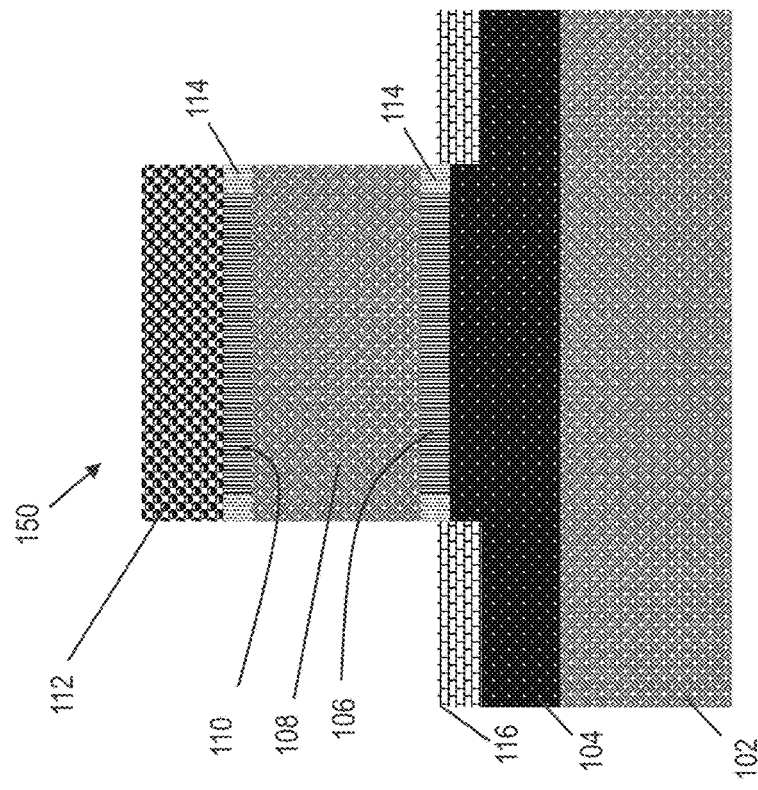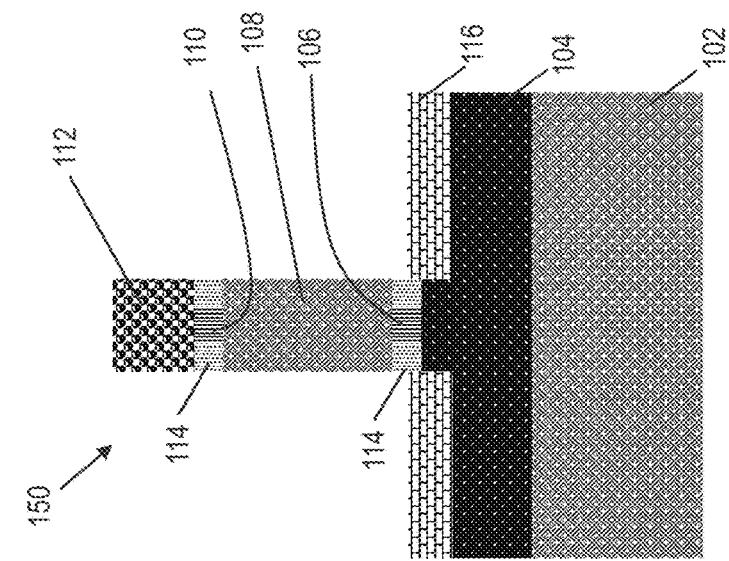

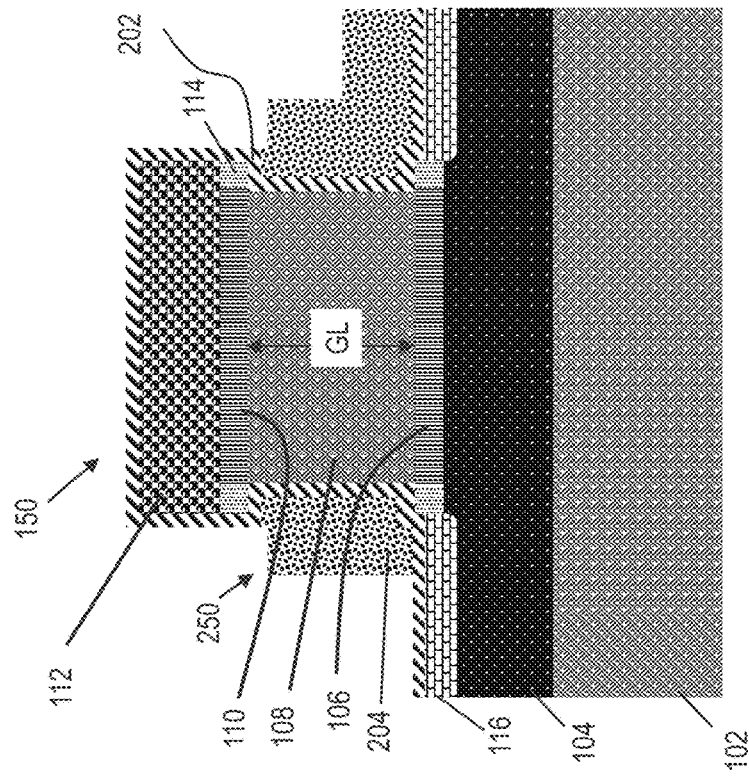
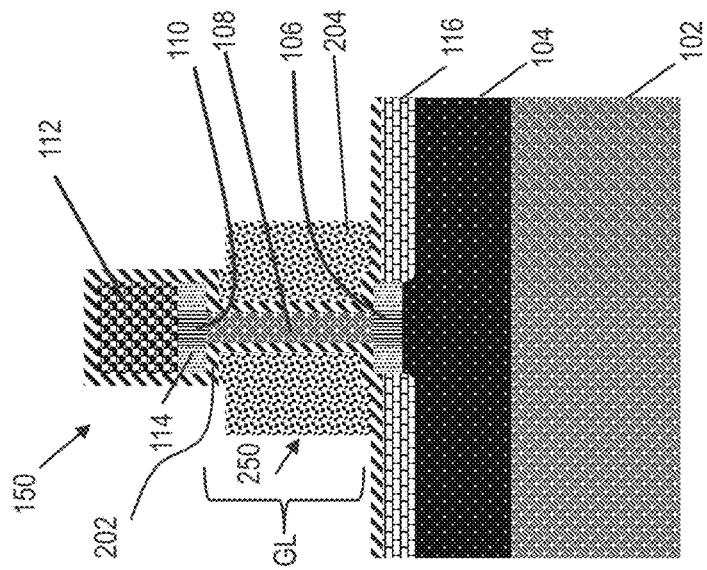

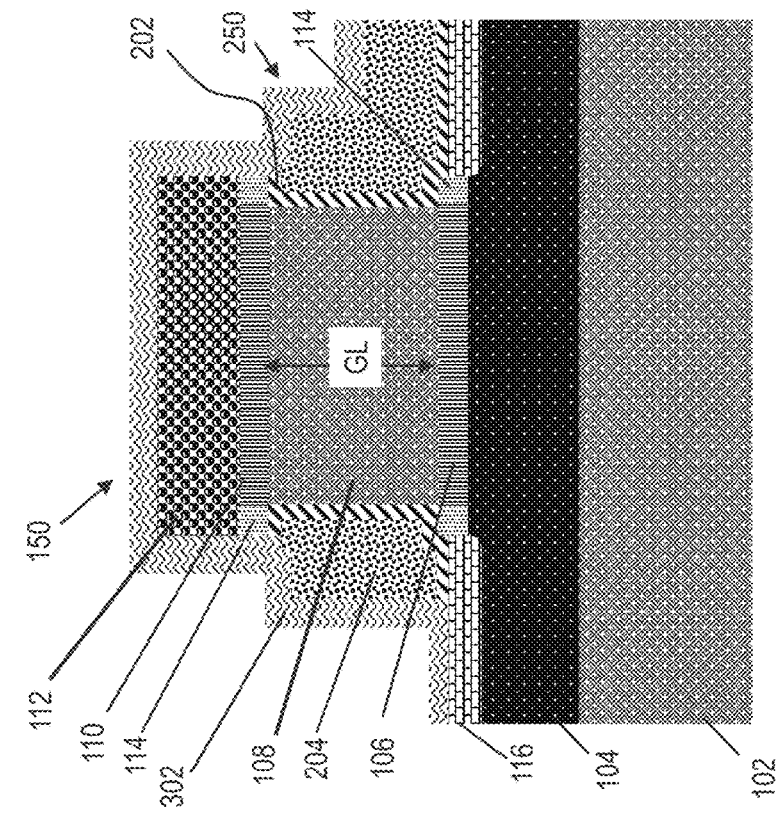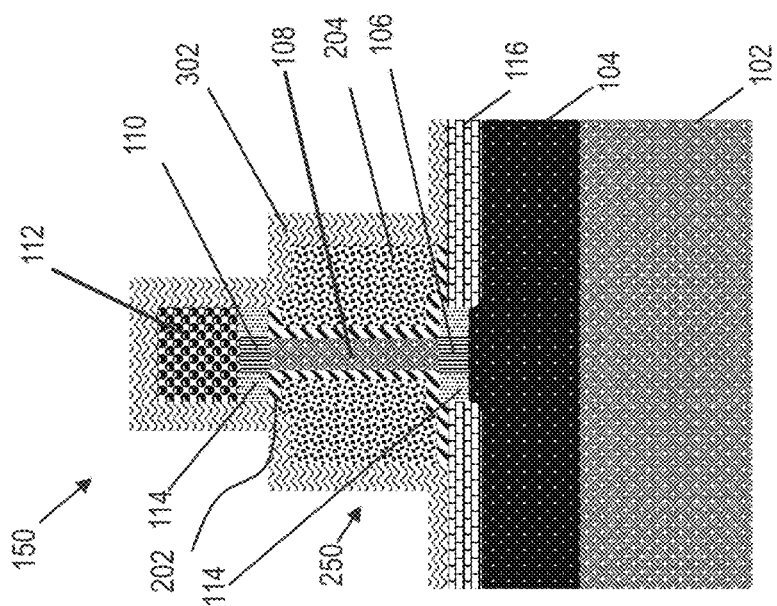

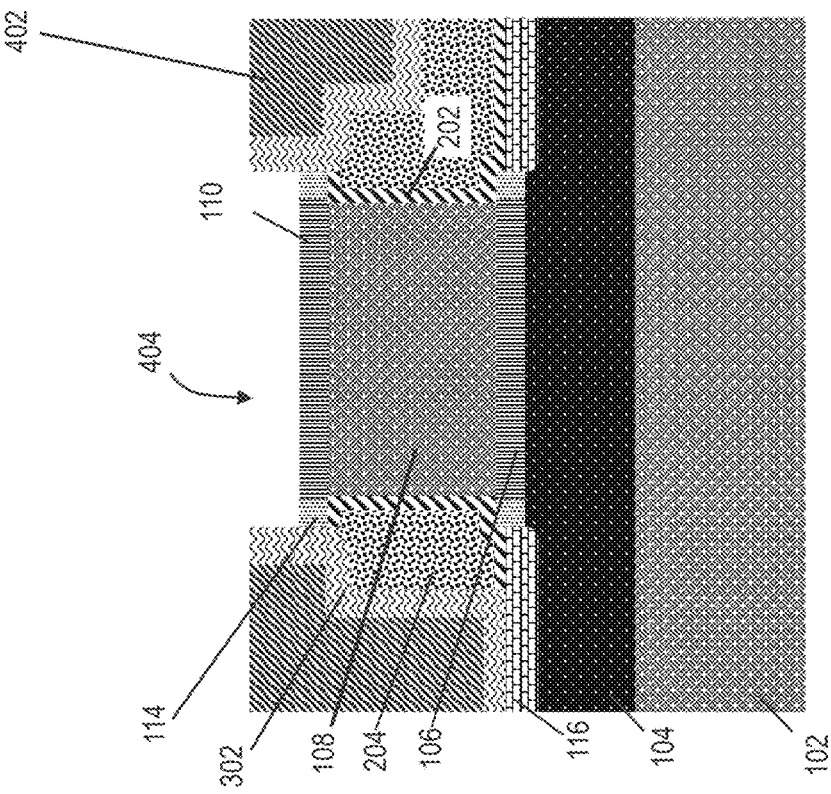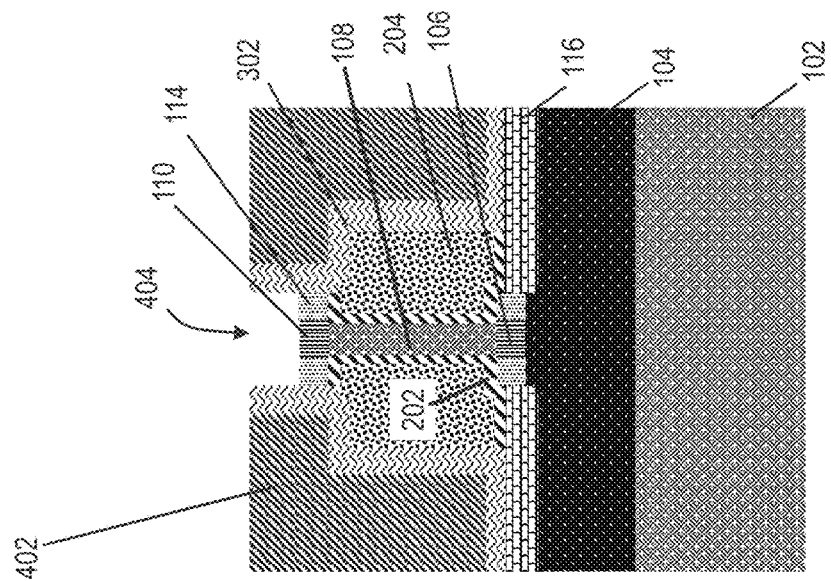

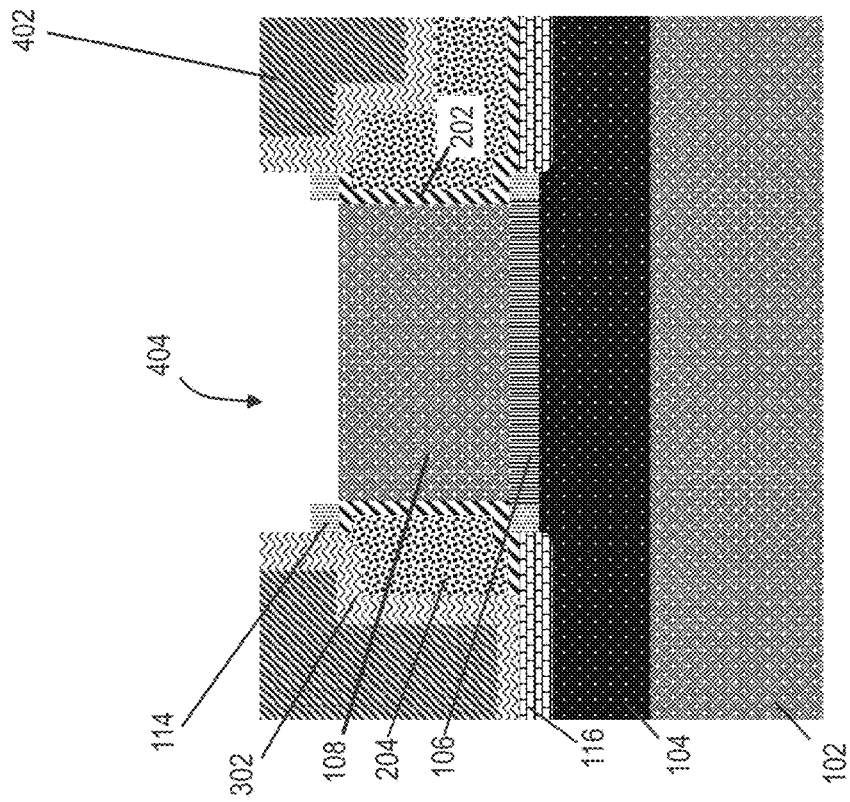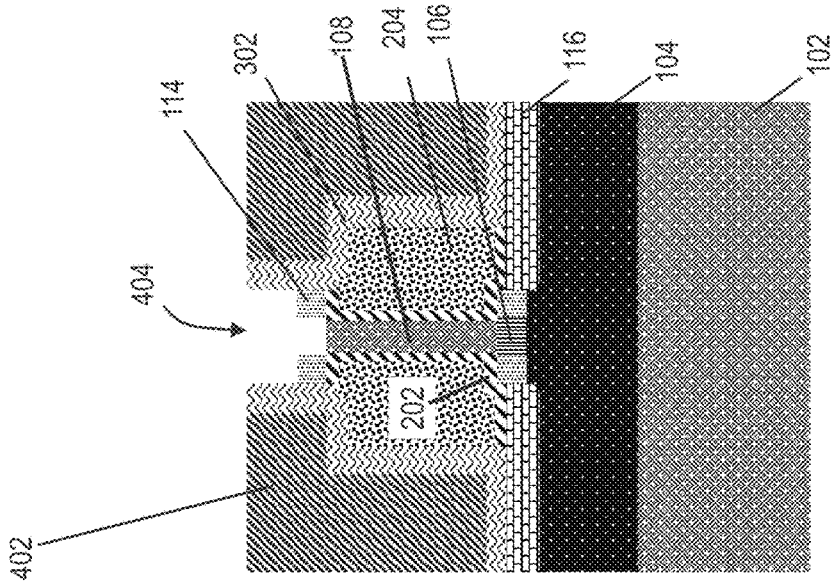

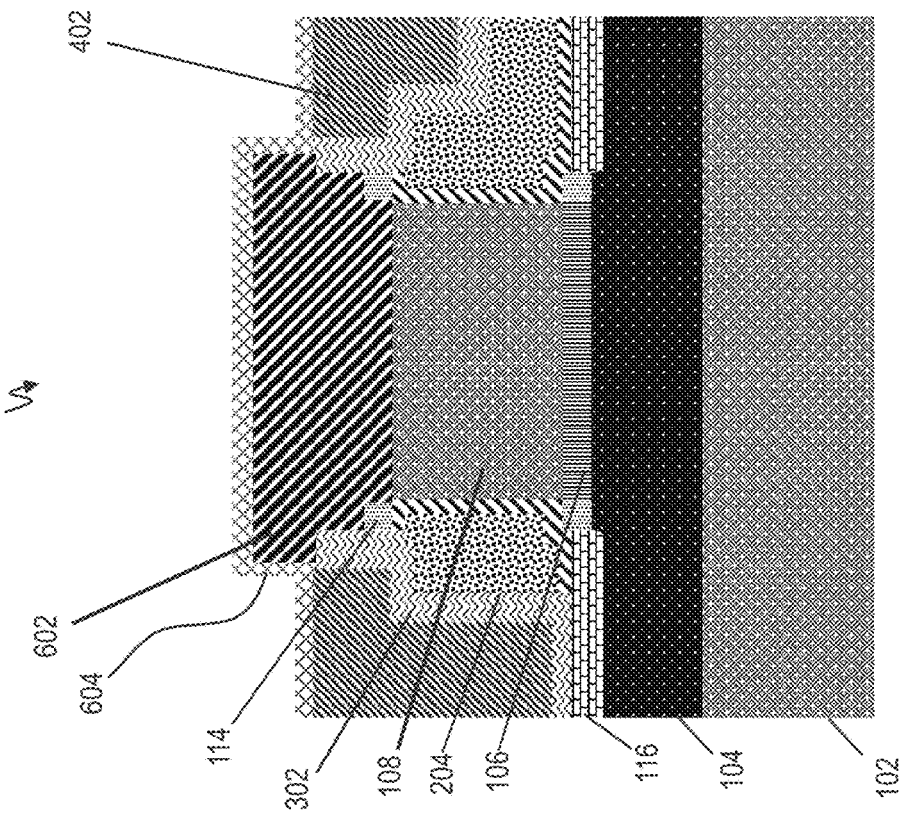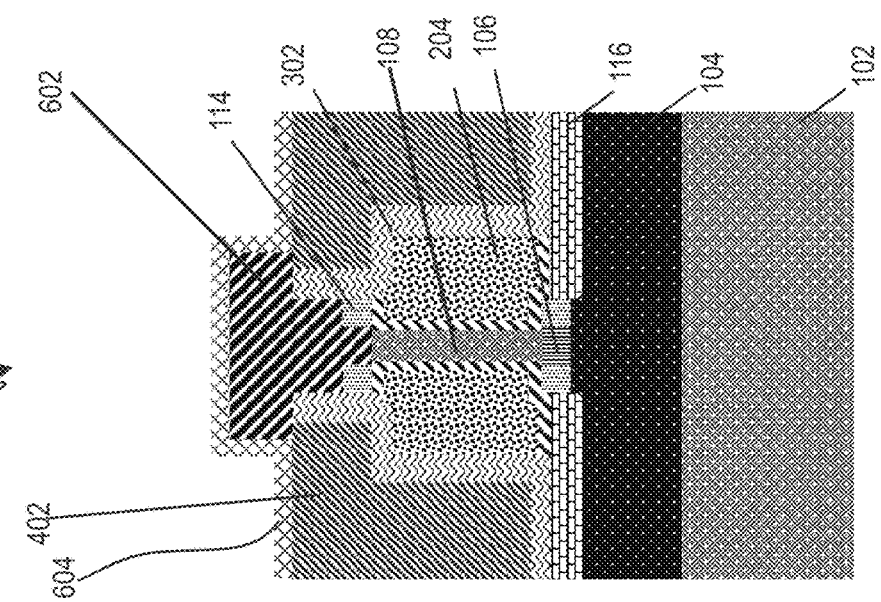

FIN LENGTH CROSS-SECTION

FIN WIDTH CROSS-SECTION

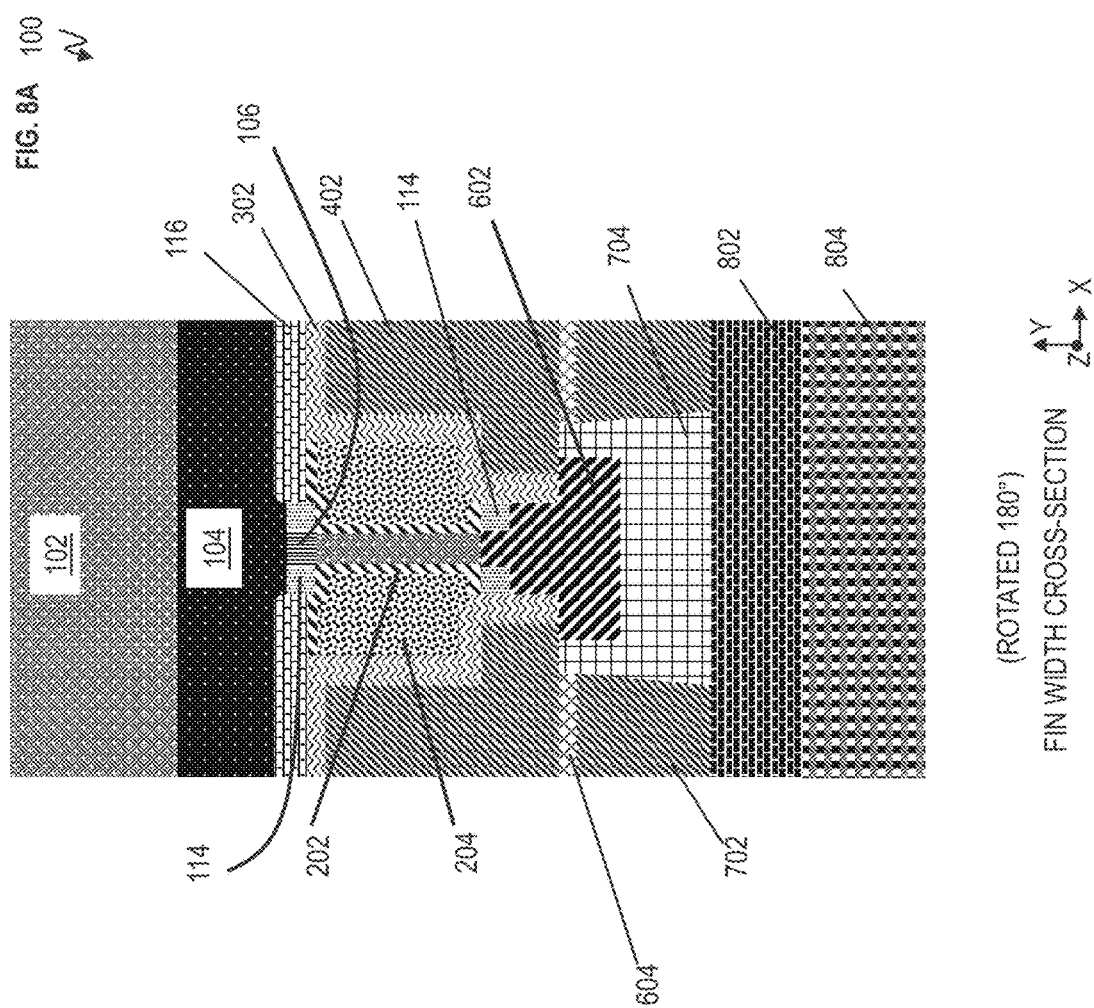

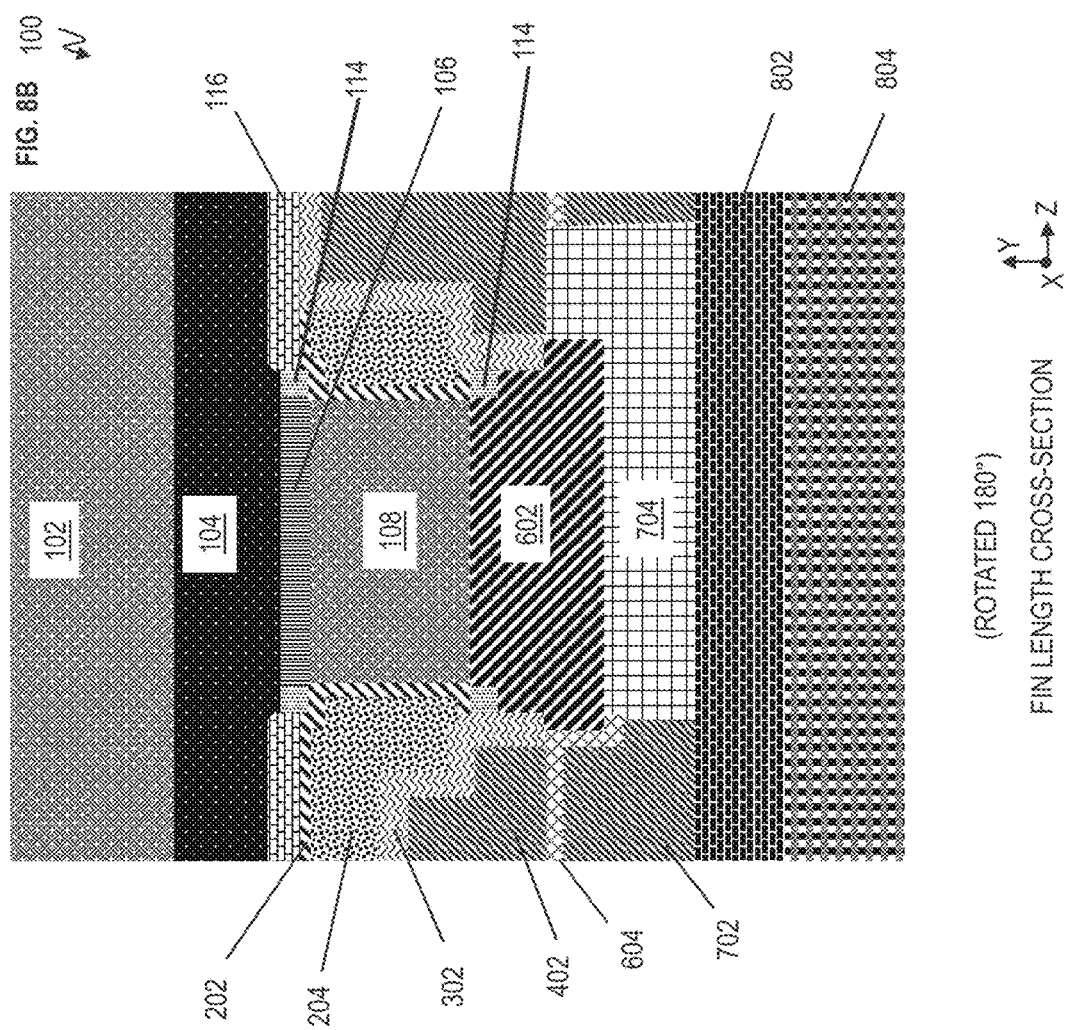

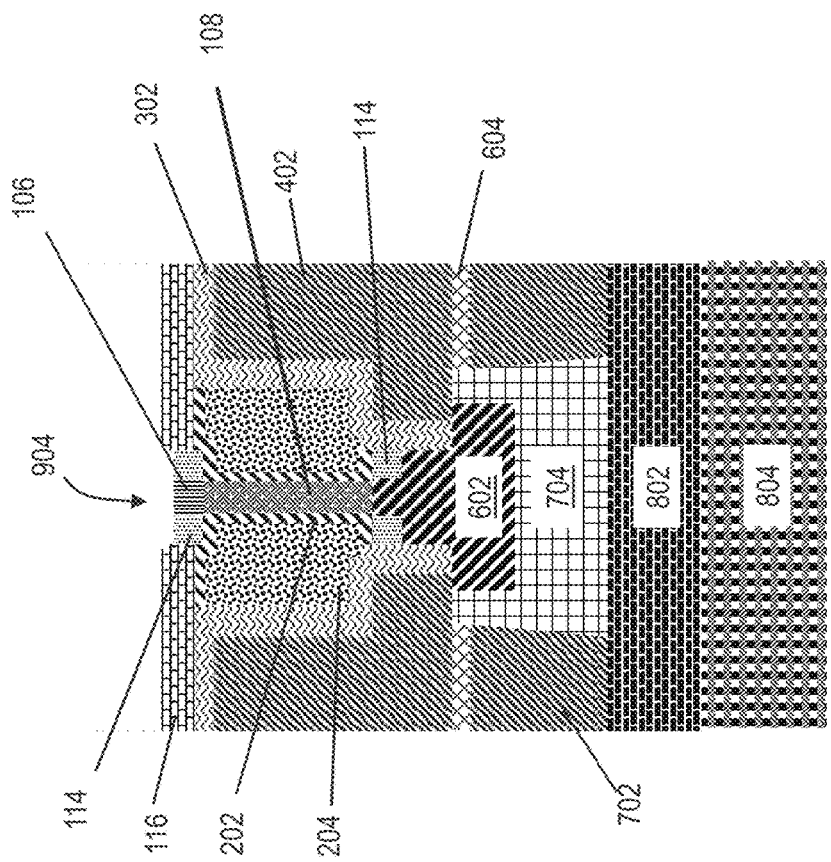

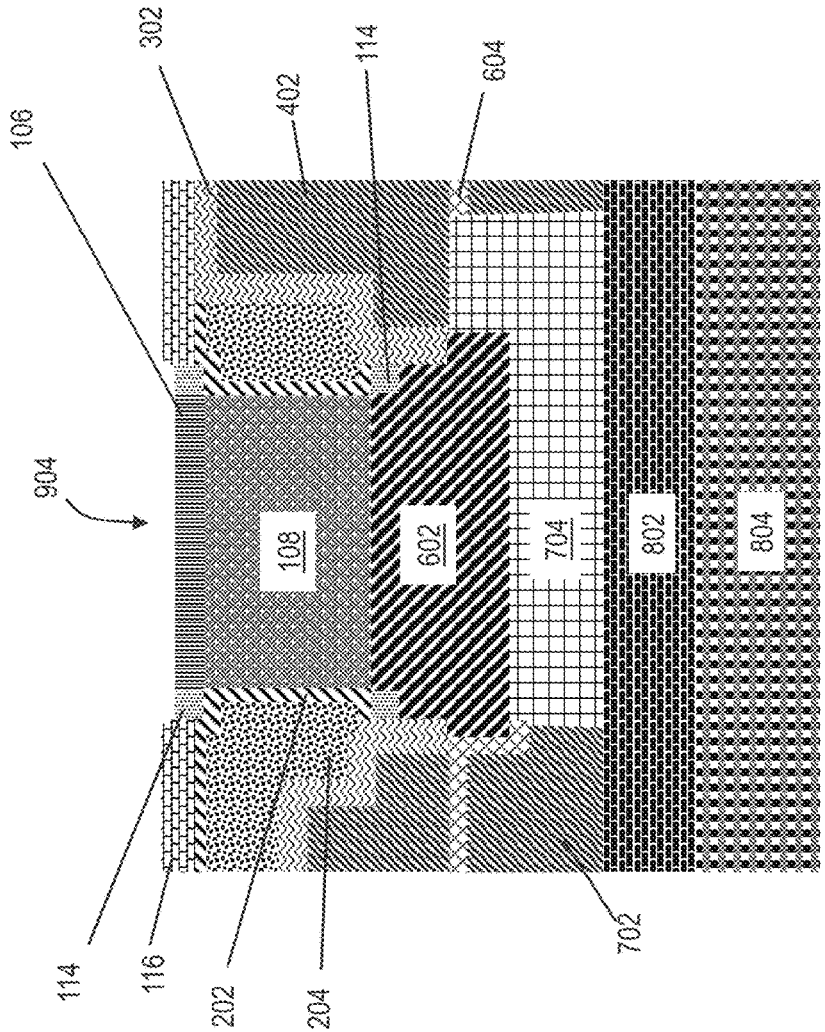

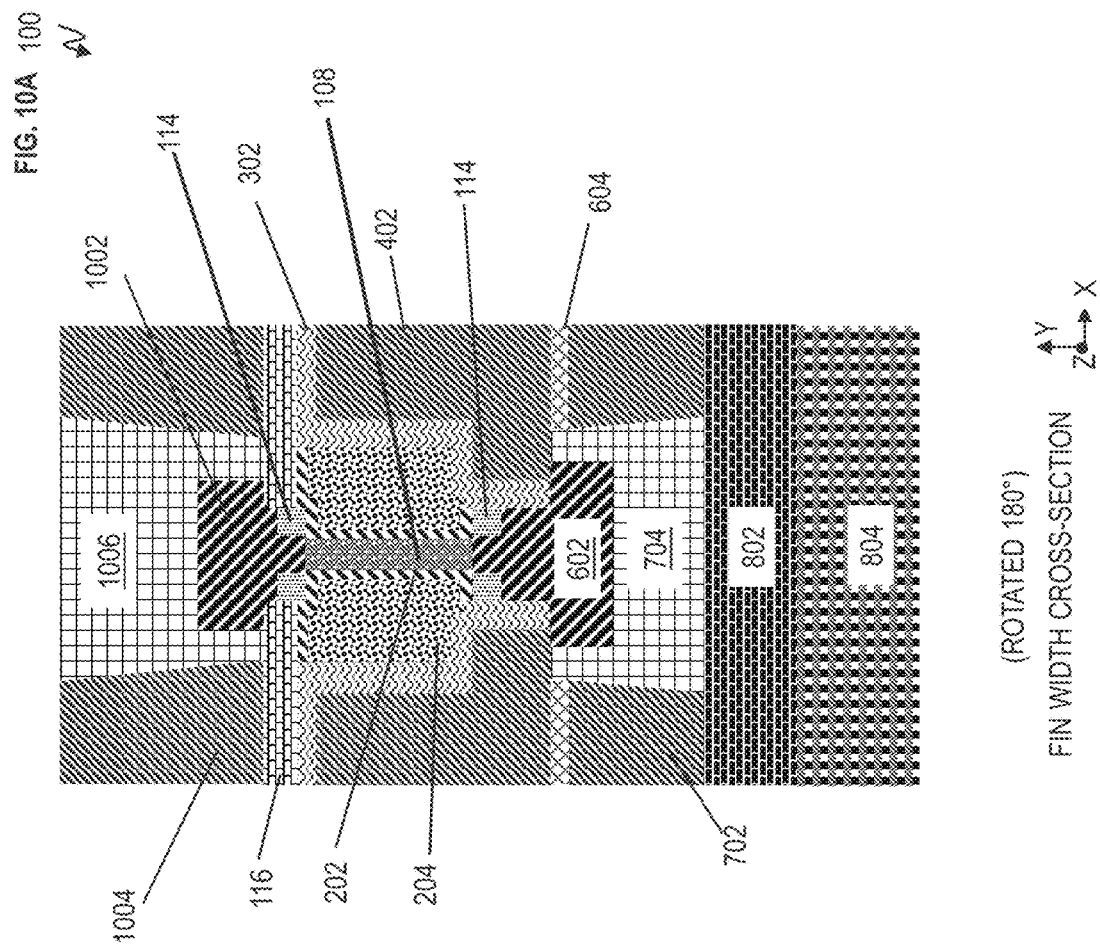

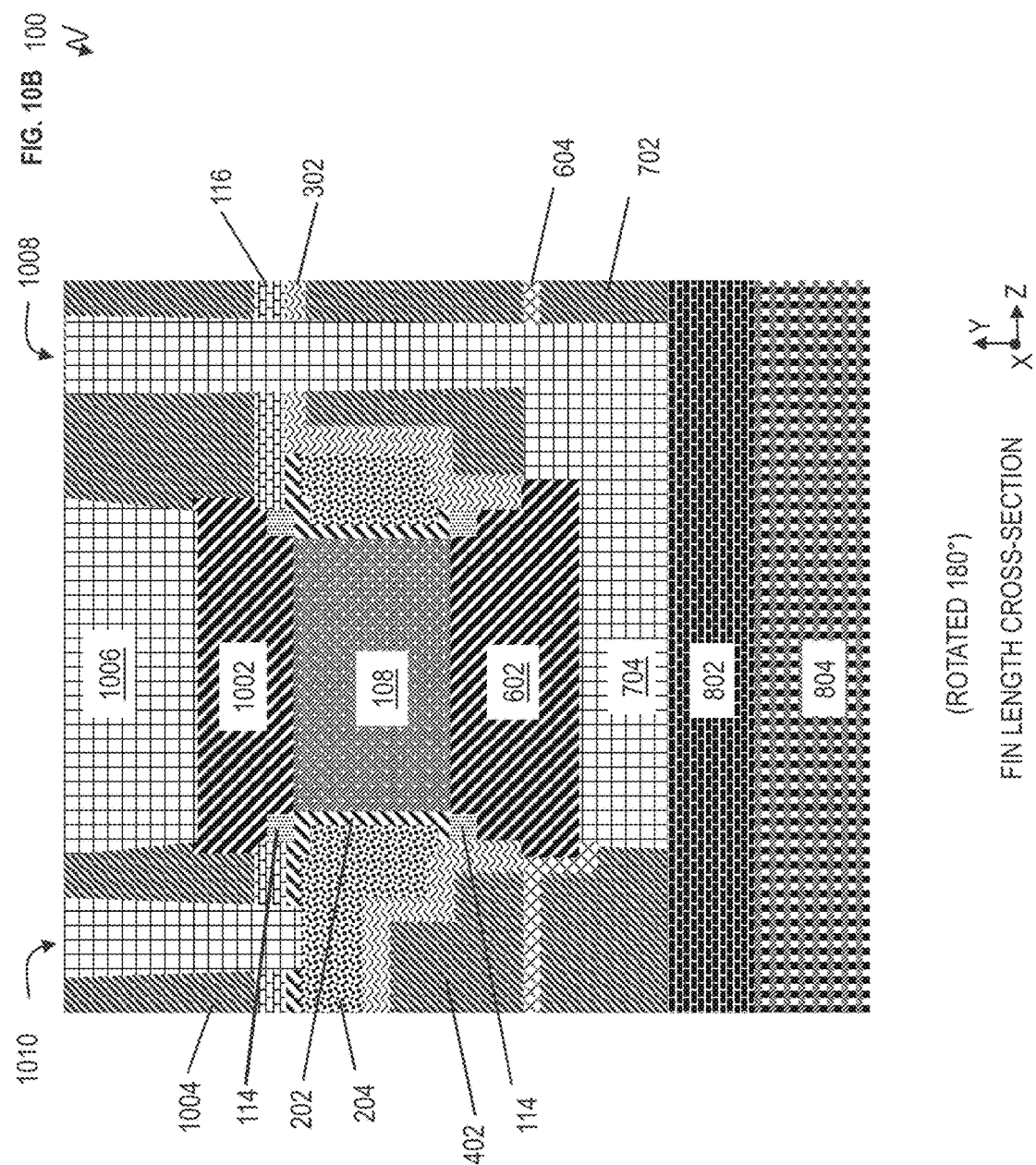

FLIPPED VFET WITH SELF-ALIGNED JUNCTIONS AND CONTROLLED GATE LENGTH

BACKGROUND

The present invention generally relates to fabrication methods and resulting structures for semiconductor devices, and more specifically, to a flipped vertical field effect transistor (VFET) with self-aligned junctions and controlled gate length.

A metal-oxide-semiconductor field-effect transistor (MOSFET) is used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers.

One type of MOSFET is a non-planar FET known generally as a VFET. VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls.

SUMMARY

Embodiments of the invention are directed to a method for forming a semiconductor device. A non-limiting example of the method includes forming a vertical channel layer with inner spacers on opposite ends of the vertical channel layer and forming a gate stack having a gate length determined by the inner spacers. The method includes forming source or drain (S/D) regions on the opposite ends of the vertical channel layer.

Embodiments of the invention are directed to a method for forming a semiconductor device. A non-limiting example of the method includes sandwiching a vertical channel layer between sacrificial layers, recessing sides of the sacrificial layers, forming inner spacers on the sides of the sacrificial layers, and forming a gate stack on the vertical channel layer, the gate stack having a gate length determined by the inner spacers. The method includes epitaxially growing a first epitaxial source or drain (S/D) region on one end of the vertical channel layer, rotating the semiconductor device about 180 degrees, and epitaxially growing a second epitaxial S/D region on an opposite end of the vertical channel layer.

Embodiments of the invention are directed to a semiconductor device. A non-limiting example of the semiconductor device includes a vertical channel layer with inner spacers on opposite ends of the vertical channel layer and a gate stack having a gate length determined by the inner spacers. The semiconductor device includes epitaxial source or drain (S/D) regions on the opposite ends of the vertical channel layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a cross-sectional view of a semiconductor device along a fin width after an initial set of fabrication operations according to embodiments of the invention;

FIG. 1B depicts another cross-sectional view of the semiconductor device in FIG. 1A taken along the fin length after the initial set of fabrication operations according to embodiments of the invention;

FIG. 2A depicts a cross-section view of the semiconductor device along the fin width after fabrication operations according to embodiments of the invention;

FIG. 2B depicts another cross-sectional view of the semiconductor device in FIG. 2A taken along the fin length after fabrication operations according to embodiments of the invention;

FIG. 3A depicts a cross-section view of the semiconductor device along the fin width after fabrication operations according to embodiments of the invention;

FIG. 3B depicts another cross-sectional view of the semiconductor device in FIG. 3A taken along the fin length after fabrication operations according to embodiments of the invention;

FIG. 4A depicts a cross-section view of the semiconductor device along the fin width after fabrication operations according to embodiments of the invention;

FIG. 4B depicts another cross-sectional view of the semiconductor device in FIG. 4A taken along the fin length after fabrication operations according to embodiments of the invention;

FIG. 5A depicts a cross-section view of the semiconductor device along the fin width after fabrication operations according to embodiments of the invention;

FIG. 5B depicts another cross-sectional view of the semiconductor device in FIG. 5A taken along the fin length after fabrication operations according to embodiments of the invention;

FIG. 6A depicts a cross-section view of the semiconductor device along the fin width after fabrication operations according to embodiments of the invention;

FIG. 6B depicts another cross-sectional view of the semiconductor device in FIG. 6A taken along the fin length after fabrication operations according to embodiments of the invention;

FIG. 8A depicts a cross-section view of the semiconductor device along the fin width after fabrication operations according to embodiments of the invention;

FIG. 8B depicts another cross-sectional view of the semiconductor device in FIG. 8A taken along the fin length after fabrication operations according to embodiments of the invention;

FIG. 9A depicts a cross-section view of the semiconductor device along the fin width after fabrication operations according to embodiments of the invention;

FIG. 9B depicts another cross-sectional view of the semiconductor device in FIG. 9A taken along the fin length after fabrication operations according to embodiments of the invention;

FIG. 10A depicts a cross-section view of the semiconductor device along the fin width after fabrication operations according to embodiments of the invention; and FIG. 10B depicts another cross-sectional view of the semiconductor device in FIG. 10A taken along the fin length after fabrication operations according to embodiments of the invention;

Figure 7B:
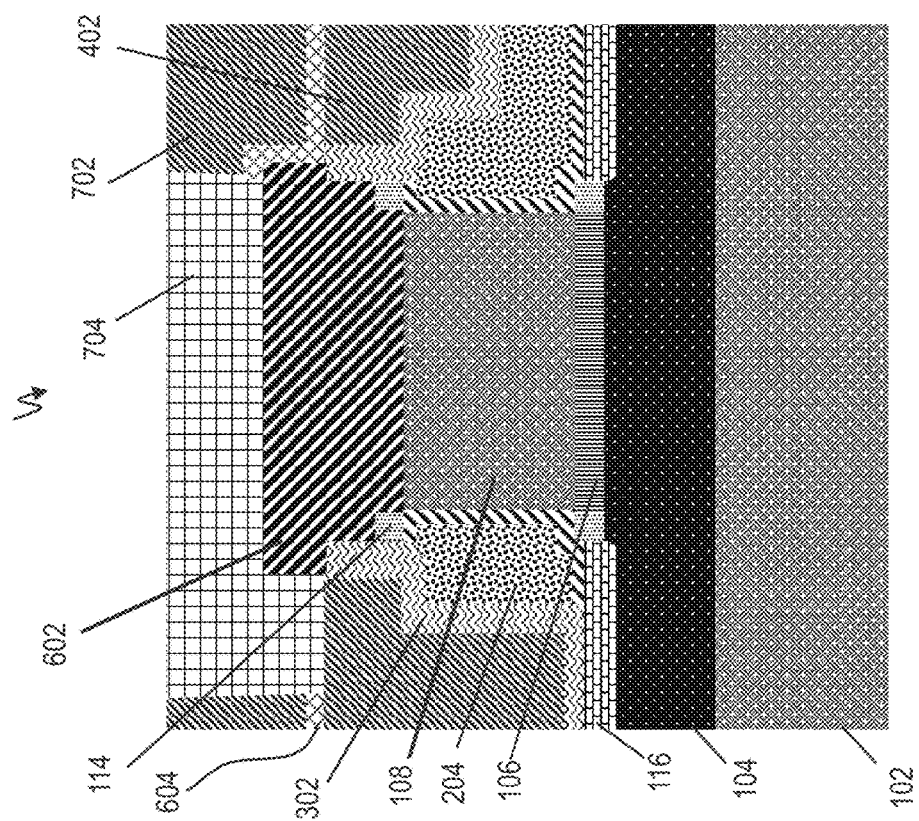
FIG. 7B depicts another cross-sectional view of the semiconductor device in FIG. 7A taken along the fin length after fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, VFETs have a vertical channel and vertical gate length. The gate length needs to be controlled. Gate length is one of the most critical parameters in a transistor device, which is directly correlated to leakage, drive current, and speed. In a state-of-the-art FET structure (either planar FET or FinFET), the gate length can be well defined by lithography or sidewall image transfer process. However, in VFET structures, those methods are not applicable.

Turning now to an overview of the aspects of the invention, one or more embodiments of the invention provide a semiconductor device and a method of forming the semiconductor device. Embodiments of the invention provide self-aligned junctions and a controlled vertical gate length via inner spacers. Also, a double-side interconnection scheme for flipped VFETs is provided. This interconnect scheme can reduce cell area, reduce parasitic capacitance, and improve contact resistance.

Turning now to a more detailed description of aspects of the present invention, FIG. 1A depicts a cross-sectional view of the semiconductor device 100 along the fin width. FIG. 1B depicts a cross-sectional view of the semiconductor device 100 along the fin length according to embodiments of the invention. The fin width is the short side or short dimension of the fin in the transistor, while the fin length is the long side or long dimension of the fin in the transistor, as understood by one skilled in the art.

FIGS. 1A and 1B depict the semiconductor device 100 after initial fabrication processing. Initially, a buffer layer 104 is deposited on a substrate 102. A first sacrificial layer 106 is deposited on the buffer layer 104. A channel layer 108 is deposited on the first sacrificial layer 106, and a second sacrificial layer 110 is deposited on the channel layer 108. A hardmask layer 112 is deposited on top of the second sacrificial layer 110. The thickness of the layers 104, 106, 108, and 110 can be well controlled by, for example, epitaxial growth.

The substrate 102 is a semiconductor material. The substrate 102 can be a silicon substrate, although other materials can be used as the substrate 102. The substrate can be, for example, a silicon-on-insulator substrate. The buffer layer 104 can be, for example, an oxide such as silicon dioxide, a nitride such as silicon nitride, etc. The first and second sacrificial layers 106 and 110 (or bottom and top) can be, for example, silicon germanium, silicon nitride, etc. The first and second sacrificial layers 106 and 110 are to be a material that can be selectively etched with respect to other materials. The sacrificial layers 106 and 110 are each an extension region that makes self-aligned junctions. The hardmask layer 112 can be, for example, silicon nitride. The hardmask layer 112 is used for fin patterning.

Etching is performed to make vertical fins 150 as depicted in FIGS. 1A and 1B. The fin width in the x-axis in FIG. 1A and the fin length in the z-axis in the FIG. 1B are larger than the target size. The etching can include patterning the hardmask layer 112, for example, using a photoresist material as understood by one skilled in the art. The patterned hardmask layer 112 is also referred to as a fin hardmask. A directional etch, such as, reactive ion etching can be utilized to etch the second sacrificial layer 110, the channel layer 108, the first sacrificial layer 106, and an upper portion of the buffer layer 104, where the layers under the hardmask layer 112 are protected.

FIGS. 1A and 1B illustrate that inner spacers 114 are formed on the sides of first and second sacrificial layers 106 and 110 so as to be under the hardmask layer 112. The inner spacers 114 set the gate length (GL, which corresponds to the thickness of layer 108) in the vertical direction, i.e., in the y-axis for the semiconductor device 100. The inner spacers 114 can be formed by, first recessing the (SiGe) sacrificial layers 106 and 110, depositing the inner spacer material to pinch of the gaps formed by the recessing, and performing an etch back to remove the unwanted part of the inner spacer material, thereby leaving the inner spacers 114 under patterned hardmask layer 112. The material of the inner spacers 114 can be for example, SiBCN. Other examples of the inner spacer material can include SiCO, SiN, SiOCN.

Further, an outer spacer 116 is formed on top of the buffer layer 104. The outer space 116 can be deposited and etched back. The position of the outer spacer 116 can have some tolerance because the inner spacers 114 determine the gate length.

FIG. 2A depicts a cross-sectional view of the semiconductor device 100 along the fin width according to embodiments of the invention. FIG. 2B depicts a cross-sectional view of the semiconductor device 100 along the fin length according to embodiments of the invention.

FIGS. 2A and 2B depict that the channel layer 108 of the vertical fin 150 has been further reduced in size and that gate materials are formed. The channel layer 108 can be selectively etched in the x and z-axes to a size underneath the second sacrificial layer 110, and the height in the y-axis of the channel is fixed. The sacrificial layers 106 and 110 are cladded by the inner spacer 114. The sacrificial layers 106 and 110 will be the extension region or transition region between the channel layer 108 and the source and drain regions (S/D regions 602 and 1002 in FIGS. 6 and 10), and control where the junctions (also referred to as the junction between channel and S/D) are located. These two junctions are self-aligned according to the location of the sacrificial layer 106 (below in FIGS. 2A and 2B) and sacrificial layer 110 (above in FIGS. 2A and 2B) because the source/drain regions (S/D regions 602 and 1002) will replace and/or grow from the sacrificial layer 106 and sacrificial layer 110. Also, the sacrificial layer 106 is self-aligned with the inner spacer 114 on the bottom while the sacrificial layer 110 is self-aligned with the inner spacer 114 on the top, such that when sacrificial layers 106 and 110 are removed the empty spaces provide self-alignment for junctions of the S/D regions 602 and 1002 in FIGS. 6 and 10.

A high-k dielectric material 202 is deposited and a gate metal 204 is deposited on the high-k dielectric material 202. The gate metal 204 is recessed which exposes part of the high-k dielectric material 202 as depicted in FIGS. 2A and 2B. During the gate metal recess, the point where the gate metal stops is non-critical because the inner spacers 114 determine the gate length (GL) in the y-axis.

The high-k dielectric material 202 can include one or more high-k materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include a dopant such as lanthanum or aluminum. High-k dielectric materials can have a dielectric constant greater than 3.9, 7.0, or 10.0.

The gate metal 204 can include one or more work function metals. Example work function metals can include TiN, TiC, TiCAl, TaN, or any other metals used in the state of the art. The high-k dielectric material 202 and the gate metal 204 form a gate stack 250. The gate length (GL) of the gate stack 250 is set by the inner spacers 114 on opposite sides of the vertical channel layer 108, because the inner spacers 114 confine the high-k dielectric material 202 in the y-axis direction (as well as the gate metal 204 that abuts the confined high-k dielectric material 202). If the distance between the inner spacers 114 on opposite ends (in the y-axis) of the vertical channel layer 108 is shorter, the gate length (GL) would correspondingly be shorter.

FIG. 3A depicts a cross-sectional view of the semiconductor device 100 along the fin width according to embodiments of the invention. FIG. 3B depicts a cross-sectional view of the semiconductor device 100 along the fin length according to embodiments of the invention.

After recessing the gate metal 204, the exposed high-k dielectric material 202 is removed such that the high-k dielectric material 202 under the hardmask layer 112 and under the gate metal 204 remains, as depicted in FIGS. 3A and 3B. An encapsulation spacer 302 is deposited. The encapsulation spacer 302 encapsulates the high-k material 202 and the gate metal 204. The encapsulation spacer 302 can be, for example, SiBCN. Other example materials of the encapsulation spacer 302 can be SiN, SiOCN, etc.

FIG. 4A depicts a cross-sectional view of the semiconductor device 100 along the fin width according to embodiments of the invention. FIG. 4B depicts a cross-sectional view of the semiconductor device 100 along the fin length according to embodiments of the invention.

An interlevel dielectric (ILD) material 402 is formed as a fill material in FIGS. 4A and 4B. The ILD material 402 is deposited and chemical mechanical polishing/planarization (CMP) is performed to expose the hardmask layer 112. The ILD material 402 is a low-k dielectric material, such as, for example, a low-k oxide material, etc. The (SiN) hardmask layer 112 is removed to expose the second sacrificial layer 110 underneath, which creates an opening 404. The hardmask layer 112 can be etched using, for example, $H_3PO_4$. The opening 404 is prepared in anticipation of fabricating the source/drain region (S/D). Optionally, FIGS. 4A and 4B illustrate an implementation in which the second sacrificial layer 110 can remain and the source/drain region can be formed on top of the second sacrificial layer 110, and the subsequent fabrication processing continues with the second sacrificial layer 110 remaining in place such that the source/drain region can be formed directly on top of the second sacrificial layer 110.

FIG. 5A depicts a cross-sectional view of the semiconductor device 100 along the fin width according to embodiments of the invention. FIG. 5B depicts a cross-sectional view of the semiconductor device 100 along the fin length according to embodiments of the invention. FIGS. 5A and 5B illustrate an implementation in which the second sacrificial layer 110 is removed, for example, by selective etching. In this case, the opening 404 now extends further down such that the top of the channel layer 108 is exposed. Fabrication processes will continue from the implementation illustrated in FIGS. 5A and 5B. It should be appreciated, however, that subsequent fabrication processes can analogously continue from the implementation illustrated in FIGS. 4A and 4B in which the second sacrificial layer 110 remains in place, although not shown.

FIG. 6A depicts a cross-sectional view of the semiconductor device 100 along the fin width according to embodiments of the invention. FIG. 6B depicts a cross-sectional view of the semiconductor device 100 along the fin length according to embodiments of the invention.

FIGS. 6A and 6B depict a source/drain region 602 epitaxially grown from the top surface of the channel layer 108. The epitaxially grown source/drain region 602 can fill the opening 404 and be further deposited on portions of the ILD material 402 as illustrated in FIG. 6A. The epitaxially grown source/drain region 602 can be doped with p-type dopants or n-type dopants. A liner 604 is deposited on top of the semiconductor device 100. The liner 604 can be, for example, a nitride such as silicon nitride.

Figure 7A:
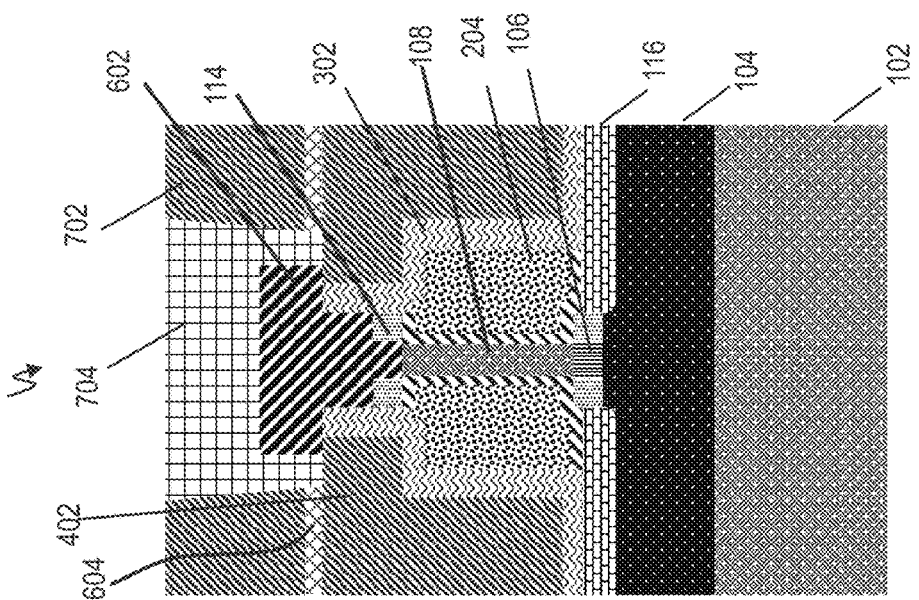
FIG. 7A depicts a cross-section view of the semiconductor device along the fin width after fabrication operations according to embodiments of the invention.

FIG. 7A depicts a cross-sectional view of the semiconductor device 100 along the fin width according to embodiments of the invention. FIG. 7B depicts a cross-sectional view of the semiconductor device 100 along the fin length according to embodiments of the invention.

Another ILD material 702 is deposited on the liner 604. The ILD material 702 can be an oxide the same as the ILD material 402 or can be a different oxide from the ILD material 402. An opening (not shown) is formed through the ILD material 702 and the liner 604 in order to expose the source/drain region 602. A contact 704 is formed on the source/drain region 602 to fill the opening. The contact 704 can be a metal contact, such as, for example, Ti, TiN, Ni, W, copper, aluminum, etc.

FIG. 8A depicts a cross-sectional view of the semiconductor device 100 along the fin width according to embodiments of the invention. FIG. 8B depicts a cross-sectional view of the semiconductor device 100 along the fin length according to embodiments of the invention.

Prior to flipping or rotating the semiconductor device 100 (or wafer) over 180° degrees, a dielectric layer 802 is formed on top of the contact 704 and the ILD material 702. The dielectric layer 802 is to protect the contact 704. The semiconductor device 100 is then rotated 180° degrees such that the top is now the bottom and the bottom is now the top in the y-axis. The dielectric layer 802 of the semiconductor device 100 is bond to a new (second) substrate 804 as depicted in FIGS. 8A and 8B. An adhesive can be utilized to bond the dielectric layer 802 to the new substrate 804. The adhesive can be an adhesive polymer, such as a glue. The substrate 804 can include the same materials or different materials as the substrate 102. At this point, the first/original substrate 102 is the top of the semiconductor device 100 in the y-axis, while the second/new substrate 804 is the bottom of the semiconductor device 100.

FIG. 9A depicts a cross-sectional view of the semiconductor device 100 along the fin width according to embodiments of the invention. FIG. 9B depicts a cross-sectional view of the semiconductor device 100 along the fin length according to embodiments of the invention.

The original (first) substrate 102 and buffer layer 104 are removed which leaves and opening 904. The substrate 102 and buffer layer 104 can be etched, for example, using chemical mechanical polishing (CMP) or wet etch, or partially by RIE. The opening exposes the first sacrificial layer 106. As discussed herein for the sacrificial layer 110, the sacrificial layer 106 can be removed prior to forming the source/drain region. In another implementation, the sacrificial layer 106 can remain and the source/drain region (S/D region 1002 in FIGS. 10A and 10B) can be formed directly on the sacrificial layer 106, although not shown. Such a case would be analogous to the source/drain region 602 being formed on directly the second sacrificial layer 110 as contemplated in FIGS. 4A and 4B (although not shown).

FIG. 10A depicts a cross-sectional view of the semiconductor device 100 along the fin width according to embodiments of the invention. FIG. 10B depicts a cross-sectional view of the semiconductor device 100 along the fin length according to embodiments of the invention.

FIGS. 10A and 10B illustrate an implementation in which the first sacrificial layer 106 has been removed, for example, by selective etching, thereby causing the opening 904 to extend further down such that the top (which was previously the bottom prior to rotating 180°) of the channel layer 108 is exposed. A source/drain region 1002 is epitaxially grown from the top surface of the flipped channel layer 108. The epitaxially grown source/drain region 1002 can fill the previous opening 904 and be further deposited on portions of the layers 106 and 116. The epitaxially grown source/drain region 1002 can be doped with p-type dopants or n-type dopants. A third layer of ILD material 1004 can be deposited on top of the semiconductor device 100 covering the source/drain region 1002 and outer spacer 116.

The third layer of ILD material 1004 can be an oxide material. The material of the ILD material 1004 can be same as or different materials from ILD material 402 and ILD material 702. Openings/vias (not shown) are formed in order to expose the source/drain region 1002, the gate metal 204, and the contact 704. Contacts 1006, 1008, and 1010 are formed in the openings/vias, as best viewed in FIG. 10B. The contacts 1006, 1008, and 1010 can be metal contacts, such as, for example, copper, gold, aluminum, silver, etc.

Although FIG. 10B illustrates the contact 1008 extending upward through layers 604, 402, 302, 116, and 1004, the contact 1008 can extend downward from contact 704 through layers 802 and 804. By having the contact 1008 extend downward instead of upward in FIG. 10B, this allows for a double-side interconnection scheme.

According to one or more embodiments of the invention, a method of forming a semiconductor device 100 is provided. The method includes forming a vertical channel layer 108 with inner spacers 114 on opposite ends of the vertical channel layer 108 (in the y-axis) and forming a gate stack 250 having a gate length (GL) determined by the inner spacers 114. The method includes forming source or drain (S/D) regions 602 and 1002 on the opposite ends of the vertical channel layer 108.

The gate stack 250 includes a high-k dielectric material 202. The high-k dielectric material 202 is confined by the inner spacers 114 on the opposite ends of the vertical channel layer 108. A vertical confinement space (in the y-axis) is formed by first spacer material of the inner spacers 114 on one of the opposite ends and second spacer material of the inner spacers 114 on another one of the opposite ends. The gate length (GL) is defined by the vertical confinement space. The first spacer material is opposite the second spacer material. A portion of a high-k dielectric material 202 in the gate stack 250 is in the vertical confinement space so as to abut sides of the vertical channel layer 108, thereby defining the gate length (GL).

The method include forming contacts 704 and 1006 on the S/D regions 602 and 1002, respectively. The method include forming a contact 1010 on the gate stack 250. The S/D regions 602 and 1002 are epitaxially grown from the opposite ends (in the y-axis) of the vertical channel layer 108.

According to one or more embodiments of the invention, a method of forming a semiconductor device 100 is provided. The method includes sandwiching a vertical channel layer 108 between sacrificial layers 106 and 110 and recessing sides of the sacrificial layers 106 and 110 (to provide an area for inner spacers 114). The method includes forming inner spacers 114 on the sides of the sacrificial layers 106 and 110. The method includes forming a gate stack 250 on the vertical channel layer 108, the gate stack 250 having a gate length (GL) determined by the inner spacers 114. The method includes epitaxially growing a first epitaxial source or drain (S/D) region 602 on one end of the vertical channel layer 108 (in the y-axis) and rotating the semiconductor device 100 (about) 180 degrees. The method includes epitaxially growing a second epitaxial S/D region 1002 on an opposite end of the vertical channel layer 108 (in the y-axis).

The sacrificial layers include one sacrificial layer 110 on the one end and another sacrificial layer 106 on the opposite end. The method includes removing the one sacrificial layer 110 prior to epitaxially growing the first epitaxial S/D region 602 on the one end of the vertical channel layer 108, and removing the another sacrificial layer 106 prior to epitaxially growing the second epitaxial S/D region 1002 on the opposite end of the vertical channel layer 108.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
    sandwiching a vertical channel layer between sacrificial layers;
    recessing sides of the sacrificial layers;
    forming inner spacers on the sides of the sacrificial layers;
    forming a gate stack on the vertical channel layer, the gate stack having a gate length determined by the inner spacers;
    epitaxially growing a first epitaxial source or drain (S/D) region on one end of the vertical channel layer;
    rotating the semiconductor device about 180 degrees; and
    epitaxially growing a second epitaxial S/D region on an opposite end of the vertical channel layer.

2. The method of claim 1, wherein the sacrificial layers comprise one sacrificial layer on the one end and another sacrificial layer on the opposite end;
    the method further comprising:
        removing the one sacrificial layer prior to epitaxially growing the first epitaxial S/D region on the one end of the vertical channel layer; and
        removing the another sacrificial layer prior to epitaxially growing the second epitaxial S/D region on the opposite end of the vertical channel layer.

* * * * *